(12) United States Patent
Yu et al.

(10) Patent No.: US 10,504,928 B2
(45) Date of Patent: Dec. 10, 2019

(54) DISPLAY PANEL

(71) Applicant: InnoLux Corporation, Miao-Li County (TW)

(72) Inventors: Yi-Ling Yu, Miao-Li County (TW); Chun-Liang Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 128 days.

(21) Appl. No.: 15/252,262

(22) Filed: Aug. 31, 2016

(65) Prior Publication Data
US 2017/0104007 A1    Apr. 13, 2017

(30) Foreign Application Priority Data

Oct. 12, 2015  (CN) .......................... 2015 1 0653771

(51) Int. Cl.
| | | |
|---|---|---|
| H01L 27/12 | (2006.01) | |
| H01L 29/786 | (2006.01) | |
| G02F 1/1345 | (2006.01) | |
| G02F 1/1368 | (2006.01) | |
| H01L 27/32 | (2006.01) | |

(52) U.S. Cl.
CPC ........ H01L 27/124 (2013.01); G02F 1/13454 (2013.01); H01L 29/7869 (2013.01); H01L 29/78696 (2013.01); G02F 1/1368 (2013.01); H01L 27/1225 (2013.01); H01L 27/3262 (2013.01)

(58) Field of Classification Search
None
See application file for complete search history.

(56) References Cited

U.S. PATENT DOCUMENTS

| | | | | |
|---|---|---|---|---|
| 6,303,963 | B1 * | 10/2001 | Ohtani ................. | G02B 27/017 257/350 |
| 2006/0060890 | A1 * | 3/2006 | You .................... | G02F 1/133555 257/222 |
| 2012/0032582 | A1 * | 2/2012 | Chang ................. | H01L 27/3269 313/504 |
| 2013/0277654 | A1 * | 10/2013 | Seo ..................... | H01L 51/5262 257/40 |
| 2016/0291380 | A1 * | 10/2016 | Hong .................. | G02F 1/13454 |
| 2016/0329357 | A1 * | 11/2016 | Cho .................... | H01L 27/1248 |
| 2016/0358948 | A1 * | 12/2016 | Wang .................. | H01L 27/124 |

FOREIGN PATENT DOCUMENTS

| | | |
|---|---|---|
| CN | 103824862 A | 5/2014 |
| CN | 104409462 A | 3/2015 |

* cited by examiner

*Primary Examiner* — Abul Kalam
(74) *Attorney, Agent, or Firm* — Bacon & Thomas, PLLC

(57) ABSTRACT

A display panel includes a substrate having a display region and a border region adjacent to the display region; a first transistor disposed on the border region and including an active layer on the substrate; and a transparent conductive layer disposed on the border region and including an opening disposed on the active layer, wherein an opening area of the opening is larger than an area of the active layer.

8 Claims, 10 Drawing Sheets

DISPLAY PANEL

CROSS REFERENCE TO RELATED APPLICATION

This application claims the benefits of the Chinese Patent Application Serial Number 201510653771.5, filed on Oct. 12, 2015, the subject matter of which is incorporated herein by reference.

BACKGROUND

1. Field of the Invention

The present disclosure relates to a display panel and, more particularly, to a display panel in which the performance of the transistor in a border region is improved.

2. Description of Related Art

In recent years, all the display devices are developed toward having small volume, thin thickness and light weight as the display techniques progresses. Hence, a conventional cathode ray tube (CRT) display is gradually replaced by a liquid crystal display (LCD) device, an organic light emitting diode (OLED) display device or the like. The LCD device or the OLED display devices can be applied to various fields. For example, the daily used devices such as cell phones, notebooks, video cameras, cameras, music players, navigation devices, and televisions are equipped with these display devices.

Although the LCD devices and OLED display devices are commercially available, and especially the techniques for the LCD devices are well matured, every manufacturer is desired to develop display devices with improved display quality to meet customers' requirement for high display quality. Herein, except for the thin film transistor structures on the display region, the structures of the thin film transistors used in the gate driver circuit on the border region are also one factor related to the overall efficiency of the display devices.

Even though the LCD devices and the OLED display devices are well developed and commercialized, it is still necessary to develop a display device with improved display quality by designing the circuit on the border region thereof to meet the customers' requirement.

SUMMARY

The object of the present disclosure is to provide a display panel, wherein for the circuit design on a border region (e.g. the gate driver circuit on panel (GOP)), transistors of a circuit is not covered with a transparent conductive layer; therefore, top gate effect between the transistor and the transparent conductive layer can be eliminated, and thus the switch and operation performance of the transistor can further be improved.

The display panel of the present disclosure comprises: a substrate comprising a display region and a border region adjacent to the display region; a first transistor disposed on the border region and comprising an active layer on the substrate; and a transparent conductive layer disposed on the border region and comprising an opening disposed on the active layer, wherein an opening area of the opening is larger than an area of the active layer.

In the display panel of the present disclosure, preferably, the opening exposes the whole active layer.

In the display panel of the present disclosure, the first transistor further comprises a gate electrode disposed on the substrate, the opening comprises a first edge and a second edge, and the gate electrode comprises a third edge and a fourth edge; wherein the first edge and the third edge locate in a width extension direction of a channel of the active layer, the first edge is adjacent to the third edge, the second edge and the fourth edge locate in a length extension direction of the channel of the active layer, and the second edge is adjacent to the fourth edge; wherein a minimum distance between the first edge and the third edge is longer than that between the second edge and the fourth edge.

In the display panel of the present disclosure, the opening comprises a first edge and a second edge, and the active layer comprises a fifth edge and a sixth edge; wherein the first edge and the fifth edge locate in a width extension direction of a channel of the active layer, the first edge is adjacent to the fifth edge, the second edge and the sixth edge locate in a length extension direction of the channel of the active layer, and the second edge is adjacent to the sixth edge; wherein a minimum distance between the first edge and the fifth edge is longer than that between the second edge and the sixth edge.

In the display panel of the present disclosure, the first transistor electrically connects to a first pad through a first transmission line, and a line width of the first transmission line is smaller than a width of the first pad.

The display panel of the present disclosure may further comprise a second transistor disposed on the border region and electrically connecting to a second pad through a second transmission line, wherein a line width of the second transmission line is smaller than a width of the second pad, and the second pad electrically connects to the first pad.

In the display panel of the present disclosure, the first transistor may further comprise: an insulating layer disposed on the active layer and comprising a via; and a first conducting electrode disposed on the insulating layer and electrically connecting to the active layer through the via, wherein a maximum length of the via in a width extension direction of a channel of the active layer is longer than another maximum length of the via in a length extension direction thereof.

In the display panel of the present disclosure, the first transistor may further comprise: a gate electrode disposed on the substrate, wherein the active layer is disposed on the gate electrode, the gate electrode comprises a third edge, and an extension direction of the third edge is substantially identical to a length extension direction of a channel of the active layer; an insulating layer disposed on the active layer and comprising a via; and a first conducting electrode disposed on the insulating layer and electrically connecting to the active layer through the via, wherein the first conducting electrode at a position above the via has a first width, the first conducting electrode at another position above the third edge has a second width, and the first width is longer than the second width.

In addition, in the display panel of the present disclosure, the term "the length extension direction of the channel of the active layer" refers to a moving direction of carriers in the channel, and the term "the width direction of the channel of the active layer" refers a direction perpendicular to the moving direction of the carrier in the channel.

Furthermore, in the display panel of the present disclosure, the active layer may comprise a metal oxide.

According to the display panel of the present disclosure, in the gate driver circuit on the border region, the transparent conductive layer on the active layer of the transistor is disposed with an opening, wherein the opening area of the opening is larger than the area of the active layer, and especially, the opening can completely expose the whole active layer. Hence, the top gate effect occurred due to the overlapping between the active layer and the transparent conductive layer can be avoided; therefore, the switch and operation performance of the transistors on the gate driver circuit can be improved. In addition, the transparent conductive layer on the transistor may influence the carrier transport in the channel; hence, in the present disclosure, an edge of the opening of the transparent conductive layer, in which a length direction of this edge is identical to a moving direction of the carriers, is designed to be distant from the channel. Hence, the problem of the deteriorated operation of the channel caused by the top gate effect occurred due to the overlapping between the active layer and the transparent conductive layer can be prevented, so the switch and operation performance of the transistors can further be improved.

Other objects, advantages, and novel features of the disclosure will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Furthermore, the ordinal numbers such as "first" and "second" used in the present specification and the appended claims are used to modify the units in the appended claims. The ordinal numbers themselves do not mean or represent the claimed units having ordinal numbers, and do not represent the order of one claimed unit to another claimed unit or the sequence of the manufacturing process. The ordinal numbers are used only for naming one claimed unit to clearly distinguish the claimed unit from the other claimed unit having the same term.

Figure 1:
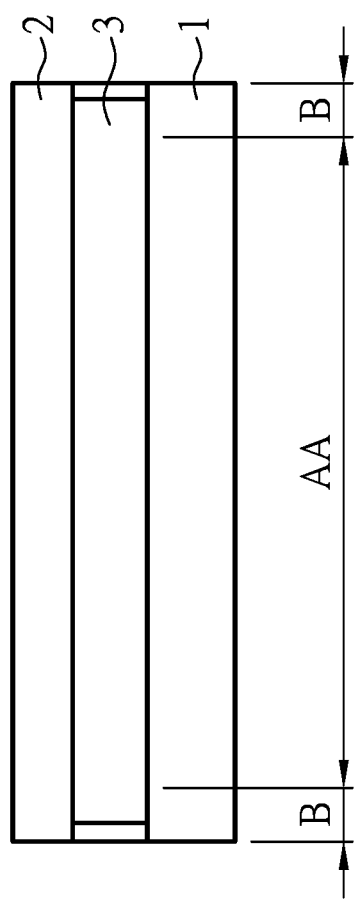
FIG. 1 is a cross-sectional view showing a display panel according to a embodiment of the present disclosure.

FIG. 1 is a cross-sectional view showing a display panel according to a embodiment of the present disclosure. The display panel of the present embodiment comprises: a first substrate 1; a second substrate 2; and a display medium layer 3 disposed between the first substrate 1 and the second substrate 2. The first substrate 1 can be a thin film transistor (TFT) substrate with TFT units (not shown in the figure) formed thereon, and the second substrate 2 can be a color filter (CF) substrate with a color filter layer (not shown in the figure) formed thereon. In other embodiment of the present disclosure, the color filter layer (not shown in the figure) can be disposed on the first substrate 1, and in this situation, the first substrate 1 is a color filter on array (COA) substrate. However, the first substrate 1 and the second substrate 2 are not limited to the aforementioned aspects. In addition, the display medium layer 3 in the display panel of the present embodiment can be a liquid crystal layer or an organic light emitting layer; but the present disclosure is not limited thereto.

As shown in FIG. 1, the display panel of the present embodiment comprises: a display region AA and a border region B surrounding the display region AA. Hereinafter, a gate driver circuit, for example, on the border region B is described below in detail.

Figure 2A:
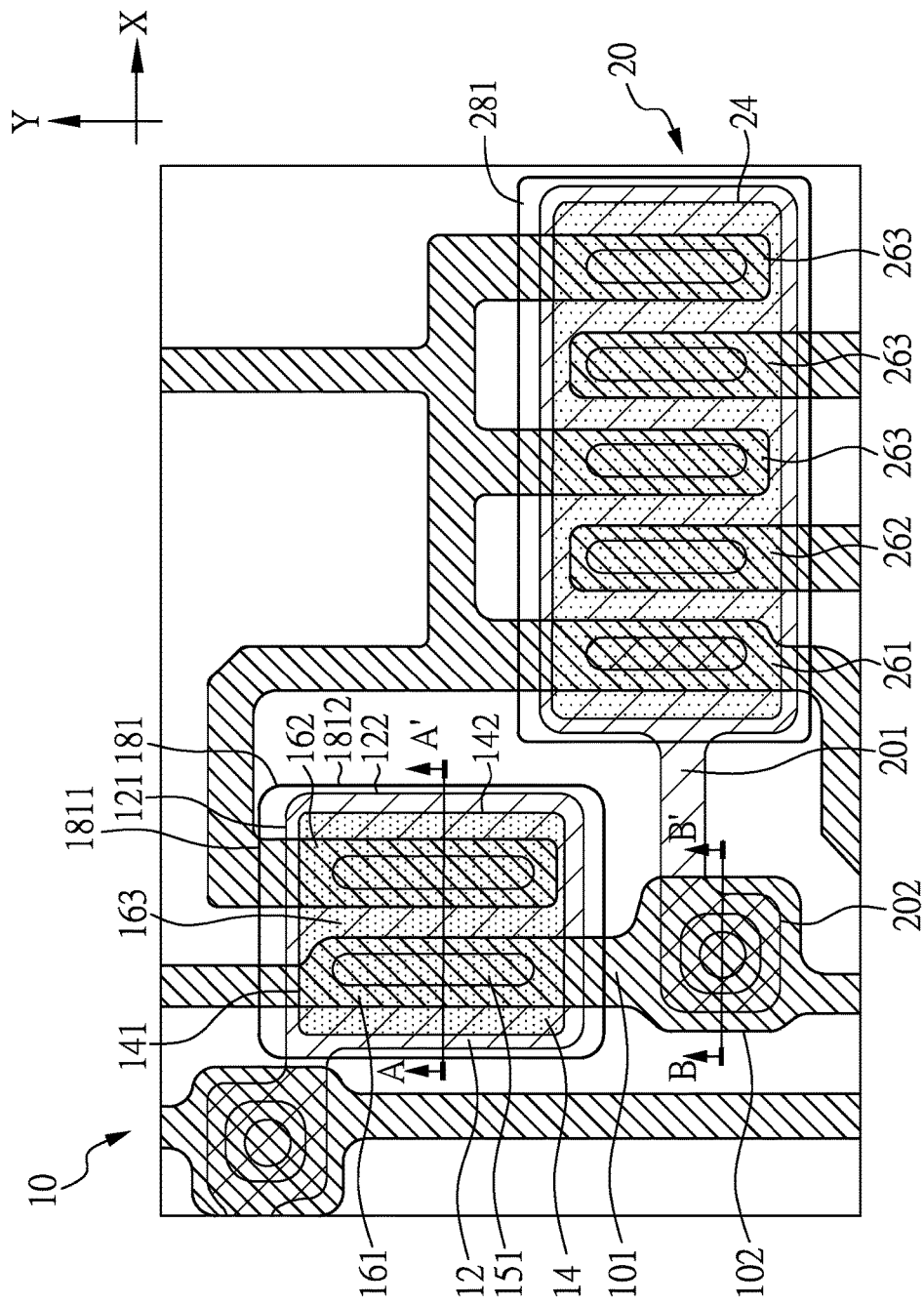
FIGS. 2A and 2B are top views showing a gate driver circuit on a border region of a display panel according to a embodiment of the present disclosure.
Figure 2B:
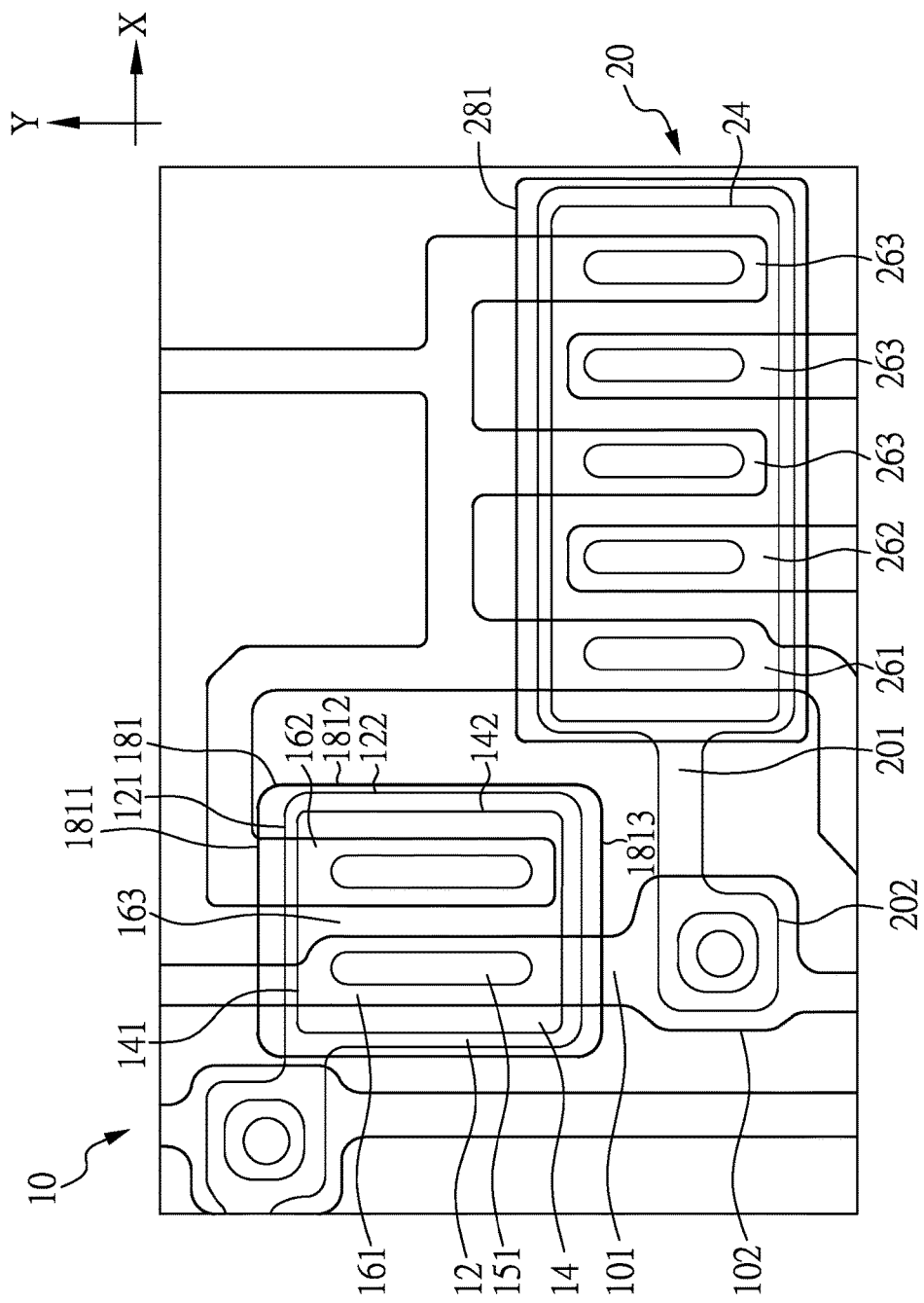
Figure 2D:
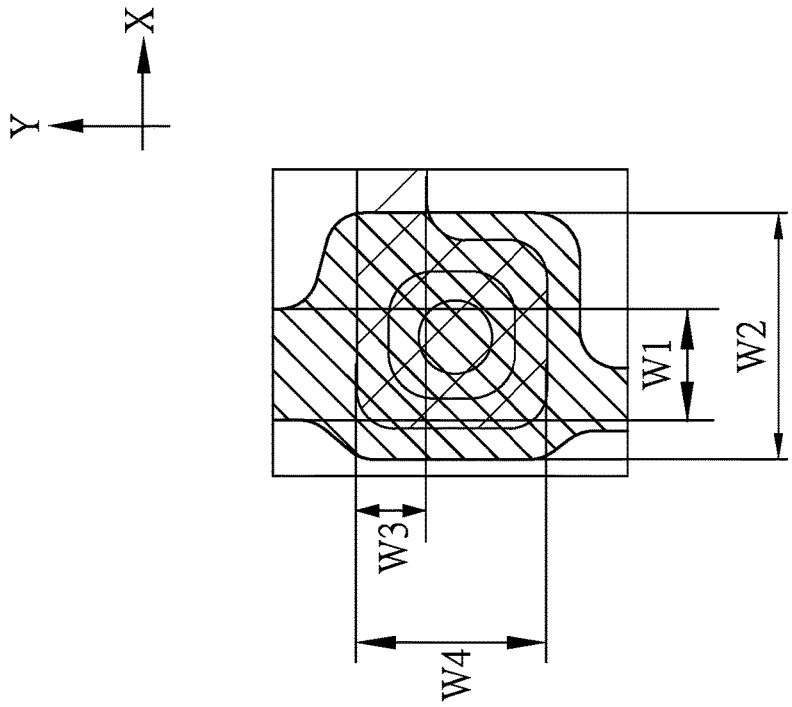
FIGS. 2C and 2D are enlarged views showing parts of a gate driver circuit on a border region of a display panel according to a embodiment of the present disclosure.
Figure 2C:
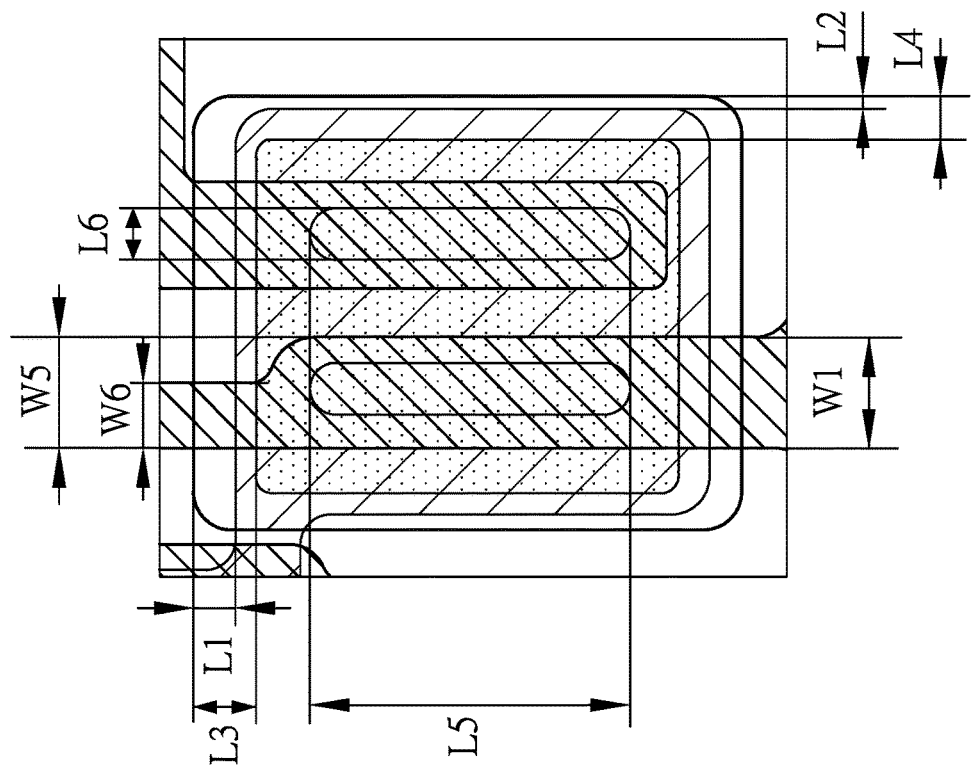
Figure 3:
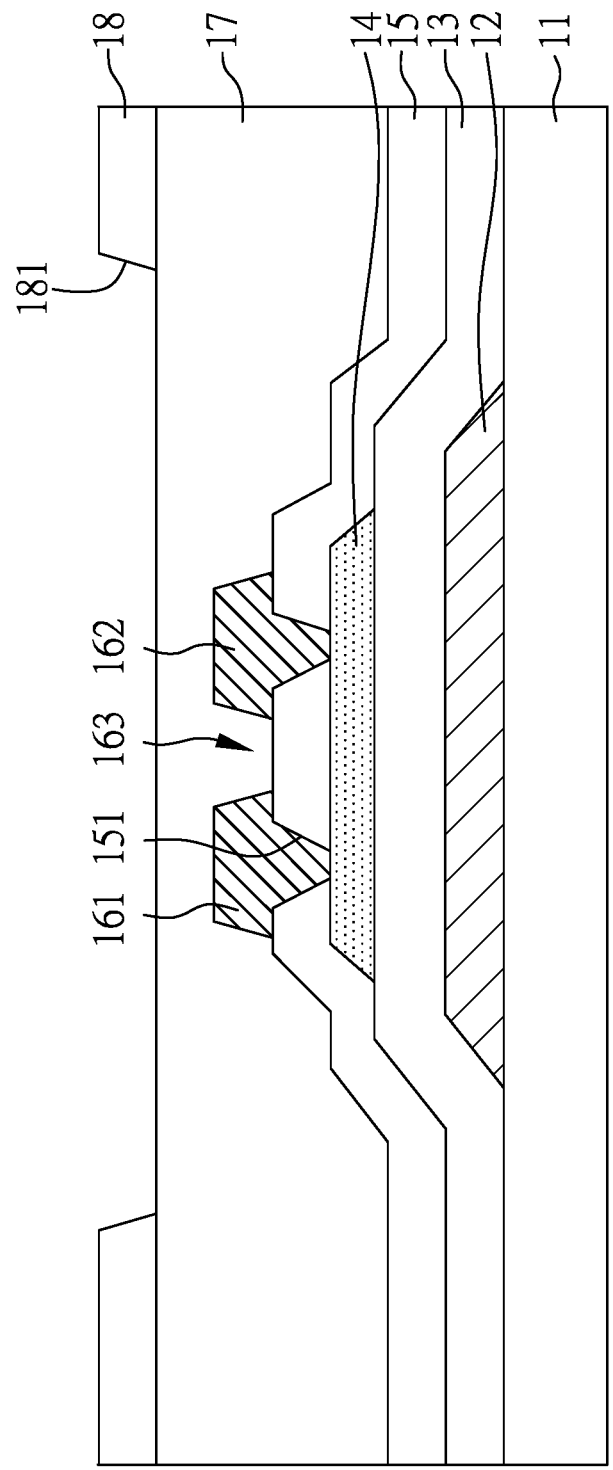
FIG. 3 is a cross-sectional view showing a first transistor on a border region of a display panel according to a embodiment of the present disclosure.
Figure 4:
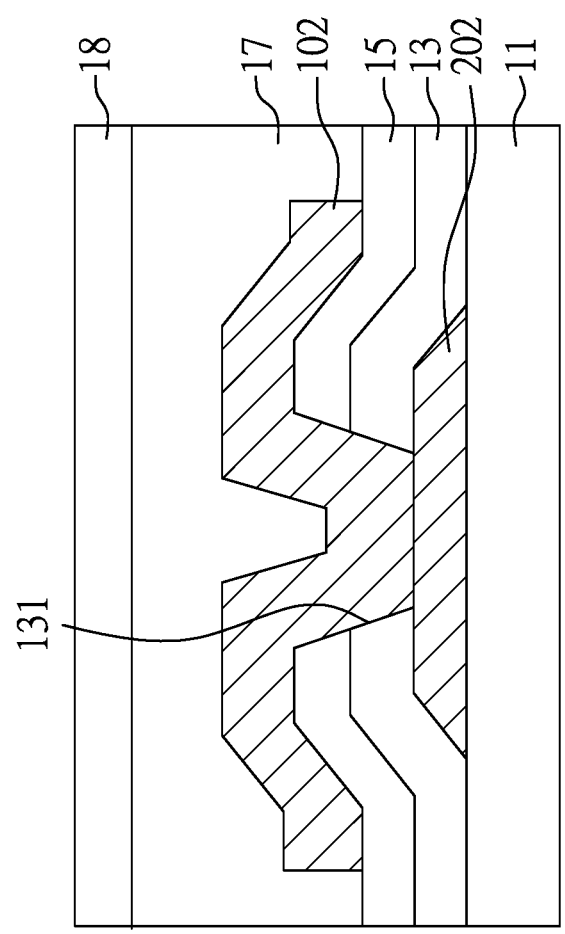
FIG. 4 is a cross-sectional view showing a first pad and a second pad on a border region of a display panel according to a embodiment of the present disclosure.

FIGS. 2A and 2B are top views showing a part of the gate driver circuit on the border region of the display panel according to a embodiment of the present disclosure, wherein FIG. 2A and FIG. 2B show the same portion of the gate driver circuit in the present embodiment, and the line hatch pattern of FIG. 2A is removed in FIG. 2B to simplify FIG. 2B for the following illustration. FIGS. 2C and 2D are enlarged views showing parts of the gate driver circuit shown in FIGS. 2A and 2B. FIG. 3 is a cross-sectional view of a transistor along the A-A' cross-sectional line shown in FIG. 2A. FIG. 4 is a cross-sectional view of a first pad and a second pad along the B-B' cross-sectional line shown in FIG. 2A.

As shown in FIGS. 2A, 3 and 4, a substrate 11 is firstly provided, and a first metal layer comprising a gate electrode 12 and a second pad 202 is formed on the substrate 11. Next, a gate insulating layer 13 is formed on the first metal layer, wherein the gate insulating layer 13 has an opening 131 corresponding to the second pad 202 to expose partial second pad 202. After forming the gate insulating layer 13, on the region for forming the first transistor 10 and the second transistor 20, an active layer 14, 24 corresponding to the gate electrode 12 is formed on the gate insulating layer 13, followed by forming an insulating layer 15 on the active layer 14, 24 and the gate insulating layer 13, wherein the insulating layer 15 comprises vias 151 to expose partial active layer 14, 24. Then, a second metal layer comprising first conducting electrodes 161, 261, second conducting electrodes 162, 262, third conducting electrodes 263 and a first pad 102 are formed on the insulating layer 15. Herein, the adjacent first conducting electrodes 161, 261, second conducting electrodes 162, 262, and third conducting electrodes 263 are spaced at a predetermined distance to form a channel 163 of the active layer 14, 24; the first conducting electrodes 161, 261, the second conducting electrodes 162, 262, and the third conducting electrodes 263 electrically connects to the active layer 14, 24; and the first pad 102 electrically connects to the second pad 202. In addition, the first conducting electrode 161 is used as a source electrode, and the second conducting electrode 162 is used as a drain electrode. Then, a protection layer 17 is formed on the insulating layer 15 and the second metal layer comprising the first conducting electrodes 161, 261, the second conducting electrodes 162, 262, the third conducting electrodes 263 and the first pad 102; and a transparent conductive layer 18 with openings 181, 281 corresponding to the active layer 14, 24 is formed on the protection layer 17. After the aforementioned process, the gate driver circuit on the border region in the display panel of the present embodiment is obtained.

In the present embodiment, the substrate 11 can be made of any substrate material such as glasses, plastics and flexible materials. The first metal layer and the second metal layer can be made of any conductive materials such as metals, alloys, metal oxides, metal nitrogen oxides or other electrode materials. The gate insulating layer 13, the insulating layer 15 and the protection layer 17 can be made of any insulating material such as oxides (for example, silicon oxides (SiOx)), nitrides (for example, silicon nitrides (SiNx)), aluminum oxides and nitrogen oxides (NOx). The active layer 14, 24 may comprise metal oxides such as IGZO, wherein the metal in the metal oxides may comprise In, Ga, Zn, Sn, Al or a combination thereof. The transparent conductive layer 18 can be made of any transparent conductive electrode material such as ITO, IZO or ITZO. However, in other embodiments of the present disclosure, the materials for the aforementioned units are not limit thereto.

As shown in FIGS. 1, 2A and 3, the obtained display panel of the present embodiment comprises: a substrate 11 comprising a display region AA and a border region B; a first transistor 10 disposed on the border region B and comprising an active layer 14 on the substrate 11; and a transparent conductive layer 18 disposed on the border region B and comprising an opening 181 disposed on the active layer 14, wherein an opening area of the opening 181 is larger than an area of the active layer 14. In addition, the display panel of the present embodiment further comprises: a second transistor 20 disposed on the border region B and comprising an active layer 24, wherein the transparent conductive layer 18 comprises an opening 281 disposed on the active layer 24, and an opening area of the opening 281 is larger than an area of the active layer 24. Especially, the openings 181, 281 completely expose the whole active layer 14, 24, respectively. Herein, the transparent conductive layer 18 on the border region B and a common electrode in the display region AA (not shown in the figure) are the same layer, and the common electrode (not shown in the figure) is grounded.

In the display panel of the present embodiment, in the region of the gate driver circuit on the border region B, the transparent conductive layer 18 has the openings 181, 281 over the active layer 14, 24 of the first transistor 10 and the second transistor 20 respectively, wherein the opening areas of the openings 181, 281 are larger than the areas of the active layer 14, 24, and especially, the openings 181, 281 can completely expose the whole active layer 14, 24. Hence, the top gate effect caused by the transparent conductive layer 18 covering the active layer 14, 24 can be prevented; therefore, the switch and operation performance of the first transistor 10 and the second transistor 20 in the gate driver circuit can be improved.

In the present embodiment, the first transistor 10 and the second transistor 20 have similar structure, except that the first transistor 10 comprises two conducting electrodes (i.e. the first conducting electrode 161 and the second conducting electrode 162) and the second transistor 20 comprises five conducting electrodes (i.e. the first conducting electrode 261, the second conducting electrode 162 and three third conducting electrodes 263). However, in other embodiments of the present disclosure, the numbers of the conducting electrodes in the first transistor 10 and the second transistor 20 are not limited to those shown in FIG. 2A, as long as the first transistor 10 and the second transistor 20 respectively comprise at least two conducting electrodes for the source and drain electrodes. In addition, in the present embodiment and other embodiments of the present disclosure, without particular explanation, the structure feature of the second transistor 20 is similar to that of the first transistor 10, and the stacking relations between the active layer 14, 24 and the openings 181, 281 of the transparent conductive layer 18 are also similar. Hence, in the present embodiment, since the structure features of the first transistor 10 and the second transistor 20 are similar, only the structure feature of the first transistor 10 is explained below.

FIG. 2C is an enlarged view of the first transistor 10 shown in FIGS. 2A and 2B. As shown in FIGS. 2A to 2C, on the border region of the display panel of the present embodiment, the first transistor 10 comprises a gate electrode 12 disposed on the substrate 11 (as shown in FIG. 3), the opening 181 comprises a first edge 1811 and a second edge 1812, and the gate electrode 12 comprises a third edge 121 and a fourth edge 122; wherein the first edge 1811 and the third edge 121 locate in a width extension direction Y of the channel 163 of the active layer 14, the first edge 1811 is adjacent to the third edge 121, the second edge 1812 and the fourth edge 122 locate in a length extension direction X of the channel 163 of the active layer 14, and the second edge 1812 is adjacent to the fourth edge 122. Herein, a minimum distance L1 between the first edge 1811 of the opening 181 and the third edge 121 of the gate electrode 12 is longer than a minimum distance L2 between the second edge 1812 of the opening 181 and the fourth edge 122 of the gate electrode 12. In the present embodiment, the term "the length extension direction X of the channel 163 of the active layer 14" refers to a moving direction of carriers in the channel 163, and the term "the width direction Y of the channel 163 of the active layer 14" refers to a direction perpendicular to the moving direction of the carrier in the channel 163.

In addition, as shown in FIGS. 2A to 2C, on the border region of the display panel of the present embodiment, the active layer 14 comprises a fifth edge 141 and a sixth edge 142; wherein the fifth edge 141 also locates in the width direction Y of the channel 163 of the active layer 14 and is adjacent to the first edge 1811, the sixth edge 142 also locates in the length extension direction X of the channel 163 of the active layer 14 and is adjacent to the second edge 1812. Herein, a minimum distance L3 between the first edge 1811 of the opening 181 and the fifth edge 141 of the active layer 14 is longer than a minimum distance L4 between the second edge 1812 of the opening 181 and the sixth edge 142 of the active layer 14.

In the present embodiment, the transparent conductive layer 18 (as shown in FIG. 3) above the first transistor 10 may influence the carrier transport in the channel 163. Hence, the first edge 1811 of the opening 181 of the transparent conductive layer 18 (as shown in FIG. 3) is designed to be relatively distant from the channel 163, in which the length direction of the first edge 1811 is substantially identical to the moving direction of the carrier in the channel 163. More specifically, in the present embodiment, the minimum distance L1 between the first edge 1811 of the opening 181 and the third edge 121 of the gate electrode 12 is designed to be longer than the minimum distance L2 between the second edge 1812 of the opening 181 and the fourth edge 122 of the gate electrode 12; and the minimum distance L3 between the first edge 1811 of the opening 181 and the fifth edge 141 of the active layer 14 is designed to be longer than the minimum distance L4 between the second edge 1812 of the opening 181 and the sixth edge 142 of the active layer 14. In this way, the gap between the transparent conductive layer 18 (as shown in FIG. 3) and the channel 163 can be increased. Thus, the transparent conductive layer 18 influencing the carrier transport in the channel 163 can be prevented in the case that the transparent conductive layer 18 is too near to the channel 163; and the top gate effect generated by the overlapping between the transparent conductive layer 18 and the active layer 14 which may affect the operation of the channel 163 can also be eliminated. Therefore, the switch and operation performance of the first transistor 10 can be improved. Herein, only the first edge 1811 of the opening 181 of the transparent conductive layer 18 (as shown in FIG. 3) is used for the explanation, the relation between the active layer 14 and the edge 1813 opposite to the first edge 1811 is identical to that between the active layer 14 and the first edge 1811, so it is not repeated herein.

As shown in FIGS. 2A to 2C, the extension direction of the third edge 121 of the gate electrode 12 in the first transistor 10 is substantially identical to the length extension direction X of the channel 163 of the active layer 14; that is, the extension direction of the third edge 121 is parallel to the length extension direction X of the channel 163 or the included angle therebetween is less than 5 degree. In addition, in the present embodiment, the insulating layer 15 (as shown in FIG. 3) is disposed on the active layer 14 and comprises a via 151; and the first conducting electrode 161 is disposed on the insulating layer 15 (as shown in FIG. 3) and electrically connects to the active layer 14 through the via 151. Compared to the first conducting electrode 161 near to the via 151, the first conducting electrode 161 corresponding to the third edge 121 of the gate electrode 12 has a shrinking structure. More specifically, the first conducting electrode 161 at the position above the via 151 has a first width W5, that at another position above the third edge 121 has a second width W6, and the first width W5 is wider than the second width W6. As for the second conducting electrode 162, the second conducting electrode 11 does not have a shrinking structure.

In the present embodiment, the first conducting electrode 161 has the shrinking structure at the position corresponding to the third edge 121 of the gate electrode 12. Since the first conducting electrode 161 connects to the input and output signal transmission lines, the portion that the first conducting electrode 161 overlaps the gate electrode 12 is designed to have at least one concave corner, to reduce the RC loading of the first conducting electrode 161 during the signal transmission. As for the second conducting electrode 162, which does not connect to the input or output signal transmission lines in the present embodiment, the second conducting electrode 162 does not required to have the shrinking structure at the position that the second conducting electrode 162 overlaps the gate electrode 12. However, the present disclosure is not limited thereto; and when the second conducting electrode 162 connects to the input and output signal transmission lines, the second conducting electrode 162 is preferably designed to have a shrinking structure at the position that the second conducting electrode 162 overlaps the gate electrode 12.

FIG. 2D is an enlarged view of the first pad 102 and the second pad 202 shown in FIGS. 2A and 2B. As shown in FIGS. 2A, 2B and 2D, the first transistor 10 electrically connects to the first pad 102 through a first transmission line 101, and a line width W1 of the first transmission line 101 is smaller than a width W2 of the first pad 102. In addition, the second transistor 20 electrically connects to the second pad 202 through a second transmission line 201, wherein a line width W3 of the second transmission line 201 is smaller than a width W4 of the second pad 202. Herein, the second pad 202 electrically connects to the first pad 102. As shown in FIGS. 2B, 2D and 4, since the second pad 202 electrically connects to the first pad 102 through the opening 131, the widths W2, W4 of the first pad 102 and the second pad 202 are respectively designed to be wider than the widths W1, W3 of the first transmission line 101 and the second transmission line 201 to facilitate the formation of the opening 131.

In addition, as shown in FIGS. 2A and 2C, the insulating layer 15 (as shown in FIG. 3) disposed on the active layer 14 comprises vias 151, and the first conducting electrode 161 and the second conducting electrode 162 on the insulating layer 15 electrically connects to the active layer 14 through the vias 151. Herein, a maximum length L5 of the via 151 in a width extension direction Y of a channel 163 of the active layer 14 is longer than another maximum length L6 of the via 151 in a length extension direction X of a channel 163 of the active layer 14. More specifically, the maximum length L5 of the via 151 in a direction vertical to the moving direction of the carrier is longer than the maximum length L6 thereof in a direction parallel to the moving direction of the carrier. Hence, the carrier transport distance can be reduced and the region for transporting the carrier can be increased; therefore, the charge transport efficiency can be improved.

Figure 5:
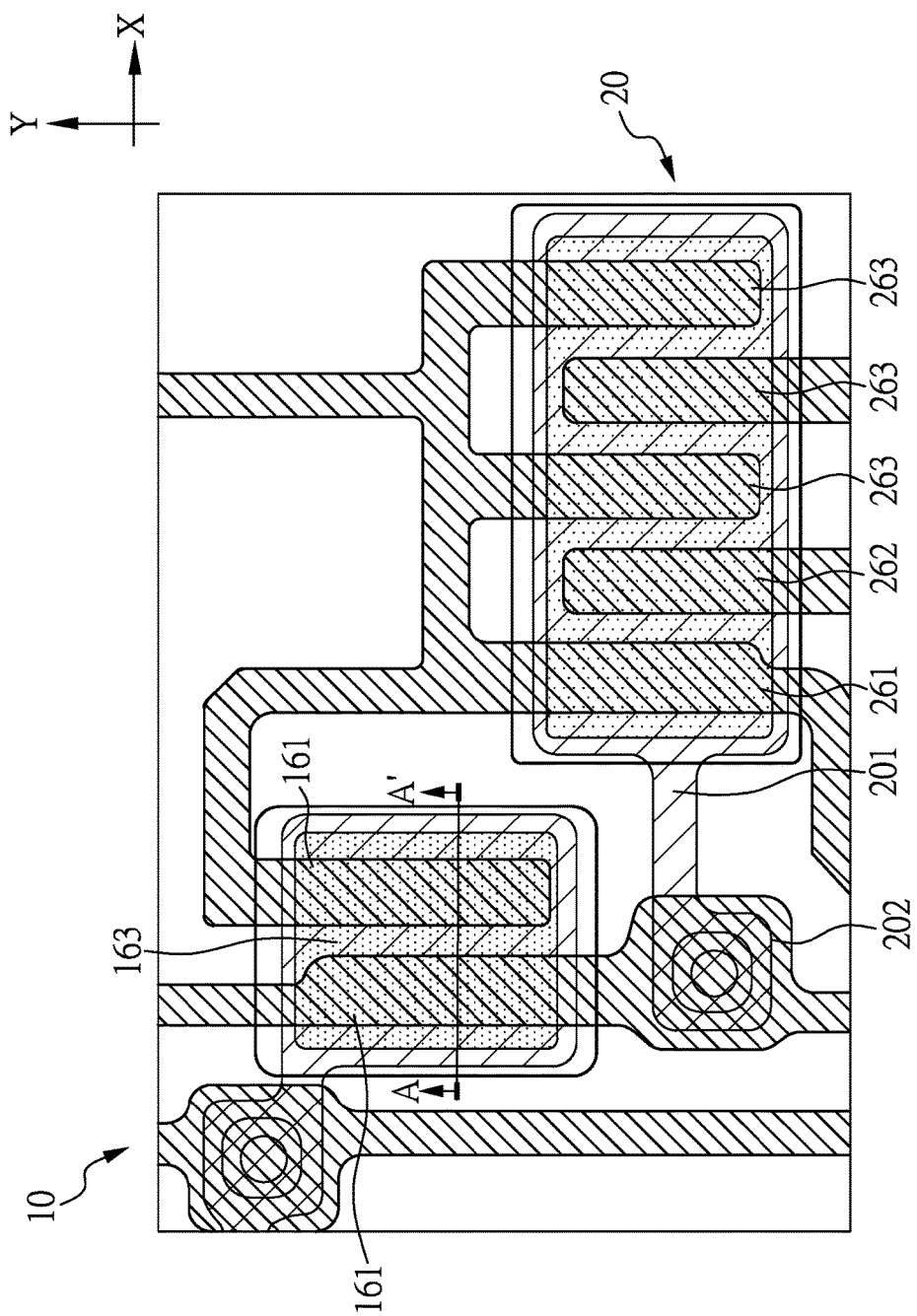
FIG. 5 is a top view showing a gate driver circuit on a border region of a display panel according to another embodiment of the present disclosure.
Figure 6:
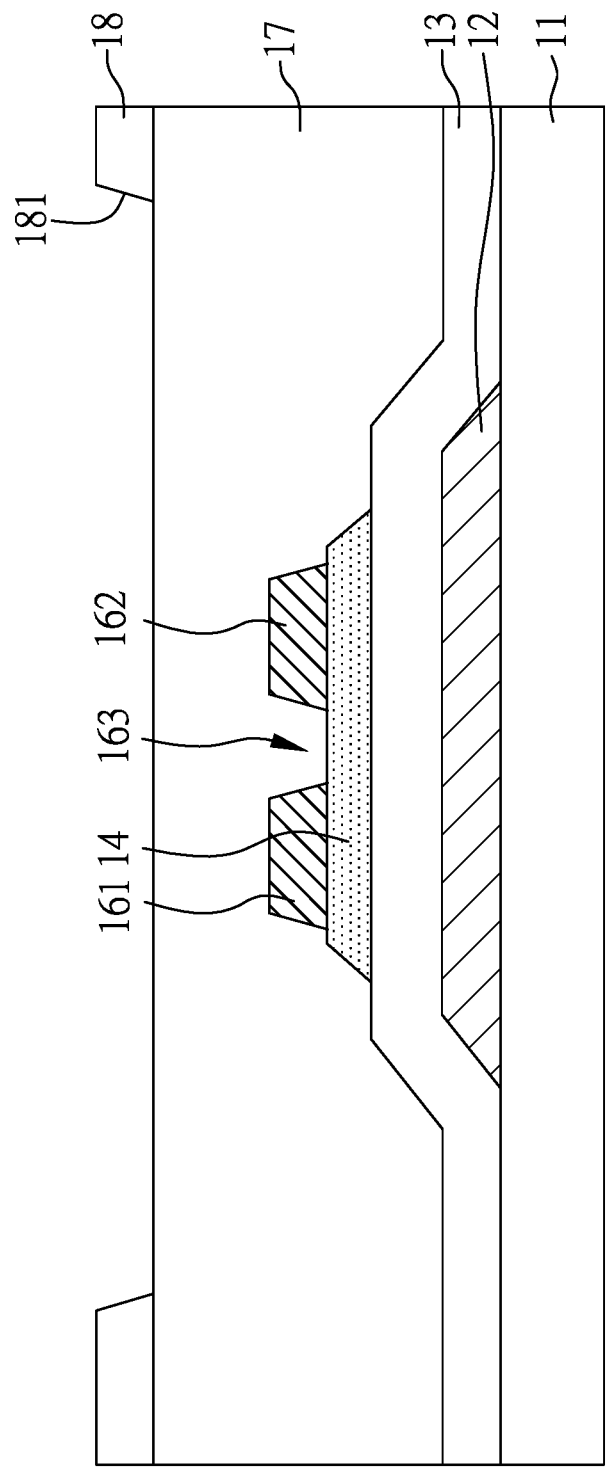
FIG. 6 is a cross-sectional view showing a first transistor on a border region of a display panel according to another embodiment of the present disclosure.

FIG. 5 is a top view showing a gate driver circuit on a border region of a display panel according to another preferred embodiment of the present disclosure; and FIG. 6 is a cross-sectional view of a transistor along the A-A' cross-sectional line shown in FIG. 5A. The structures of the display panels of the present embodiment and the forgoing embodiment are similar, except that the display panel of the present embodiment does not comprise insulating layer 15 and via 151 shown in FIG. 3.

Figure 7:
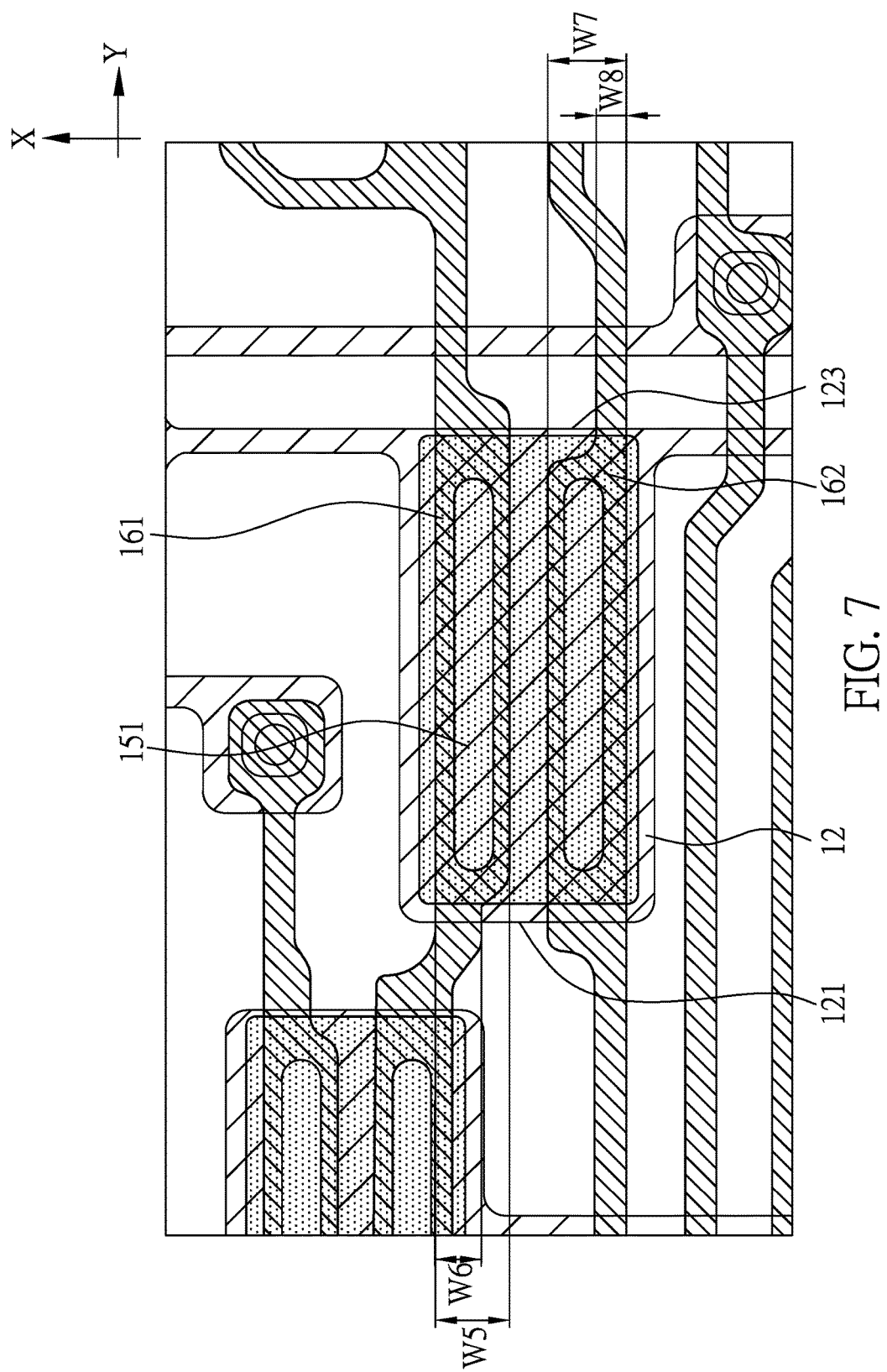
FIG. 7 is a top view showing a gate driver circuit on a border region of a display panel according to further another embodiment of the present disclosure.

FIG. 7 is a top view showing a gate driver circuit on a border region of a display panel according to further another preferred embodiment of the present disclosure, and the transparent conductive layer and the opening thereof are not illustrated in FIG. 7. The structures of the display panels of the present embodiment and the forgoing embodiment are similar, except that both the first conducting electrode 161 and the second conducting electrode 162 connect to the input and output signal transmission lines; thus, the portions that the first conducting electrode 161 and the second conducting electrode 162 overlap the gate electrode 12 are designed to have at least one concave corner. More specifically, the first conducting electrode 161 at the position above the via 151 has a first width W5, that at another position above the third edge 121 has a second width W6, and the first width W5 is wider than the second width W6. As for the second conducting electrode 162, the second conducting electrode 162 at the position above the via 151 has a third width W7, that at another position above the seventh edge 123 (opposite to the third edge 121) has a fourth width W8, and the third width W7 is wider than the fourth width W8.

Figure 8:
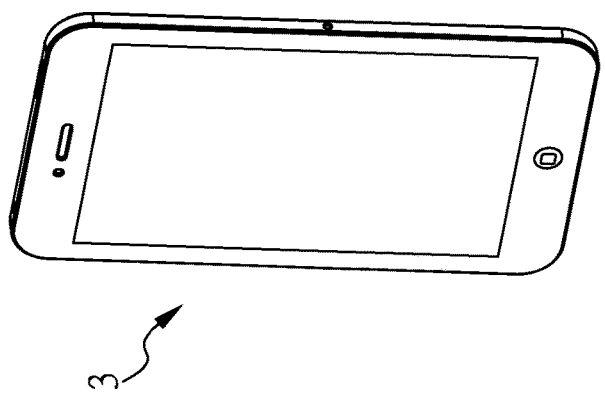
FIG. 8 is a schematic view of a display device of the present disclosure.

In the present disclosure, the display panels obtained from the aforementioned embodiments can be applied to a liquid crystal display panel or an organic light emitting diode display panel. In addition, the display panels provided by the aforementioned embodiments can also be co-used with a touch panel, to form a touch display device. Meanwhile, the display panels provided by the aforementioned embodiments or the touch display device comprising the same can be applied to any electronic device for displaying images, for example a tablet PC 3 shown in FIG. 8 or other electronic device such as a monitor, a mobile phone, a notebook, a camera, a video camera, a music player, a navigation system, or a television.

Although the present disclosure has been explained in relation to its preferred embodiment, it is to be understood that many other possible modifications and variations can be made without departing from the spirit and scope of the disclosure as hereinafter claimed.

What is claimed is:

1. A display panel, comprising:
   a substrate comprising a display region and a border region adjacent to the display region;
   a first transistor disposed on the border region and comprising an active layer and a first conducting electrode on the substrate, wherein the first conducting electrode electrically connects to the active layer; and
   a conductive layer disposed on the border region and comprising an opening, wherein the opening exposes the active layer and an area of the opening is larger than an area of the active layer, and the conductive layer partially overlaps the first conducting electrode in a top view of the border region,
   wherein the opening comprises a first edge and a second edge, and an extension direction of the first edge is different from an extension direction of the second edge; the active layer comprises a fifth edge and a sixth edge, and the fifth edge and the sixth edge are substantially parallel to the first edge and the second edge respectively; wherein the fifth edge locates between the first edge and the active layer, and the sixth edge locates between the second edge and the active layer; wherein a minimum distance between the first edge and the fifth edge is different from a minimum distance between the second edge and the sixth edge.

2. The display panel of claim 1, wherein the first transistor electrically connects to a first pad through a first transmission line, and a line width of the first transmission line is smaller than a width of the first pad.

3. The display panel of claim 2, further comprising a second transistor disposed on the border region and electrically connecting to a second pad through a second transmission line, wherein a line width of the second transmission line is smaller than a width of the second pad, and the second pad electrically connects to the first pad.

4. The display panel of claim 1, wherein the first transistor further comprises:
   an insulating layer disposed on the active layer and comprising a via; and
   a first conducting electrode disposed on the insulating layer and electrically connecting to the active layer through the via, wherein a maximum length of the via in a width extension direction of a channel of the active layer is longer than another maximum length of the via in a length extension direction thereof.

5. The display panel of claim 1, wherein the first transistor further comprises:
   a gate electrode disposed on the substrate, wherein the active layer is disposed on the gate electrode, the gate electrode comprises a third edge, and an extension direction of the third edge is substantially identical to a length extension direction of a channel of the active layer;
   an insulating layer disposed on the active layer and comprising a via; and
   a first conducting electrode disposed on the insulating layer and electrically connecting to the active layer through the via,
   wherein the first conducting electrode at a position above the via has a first width, the first conducting electrode at another position above the third edge has a second width, and the first width is larger than the second width.

6. The display panel of claim 1, wherein the active layer comprises a metal oxide.

7. The display panel of claim 1, wherein the border region is surrounding the display region.

8. A display panel, comprising:
   a substrate comprising a display region and a border region adjacent to the display region;
   a first transistor disposed on the border region and comprising an active layer and a first conducting electrode on the substrate, wherein the first conducting electrode electrically connects to the active layer; and
   a conductive layer disposed on the border region and comprising an opening, wherein the opening exposes the active layer and an area of the opening is larger than an area of the active layer, and the conductive layer partially overlaps the first conducting electrode in a top view of the border region;
   wherein the first transistor further comprises a gate electrode disposed on the substrate, the opening comprises a first edge and a second edge, and an extension direction of the first edge is different from an extension direction of the second edge; the gate electrode comprises a third edge and a fourth edge, and the third edge and the fourth edge are substantially parallel to the first edge and the second edge respectively; wherein the third edge locates between the first edge and the active layer, and the fourth edge locates between the second edge and the active layer; wherein a minimum distance between the first edge and the third edge is different from a minimum distance between the second edge and the fourth edge.

* * * * *